United States Patent
Hong

(10) Patent No.: US 10,756,120 B2
(45) Date of Patent: Aug. 25, 2020

(54) THIN FILM TRANSISTOR ARRAY SUBSTRATE AND DISPLAY APPARATUS

(71) Applicant: Wuhan China Star Optoelectronics Technology Co., Ltd., Wuhan (CN)

(72) Inventor: Guanghui Hong, Shenzhen (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 50 days.

(21) Appl. No.: 15/740,985

(22) PCT Filed: Oct. 20, 2017

(86) PCT No.: PCT/CN2017/107152
§ 371 (c)(1),
(2) Date: Sep. 6, 2018

(87) PCT Pub. No.: WO2019/061601
PCT Pub. Date: Apr. 4, 2019

(65) Prior Publication Data
US 2019/0386028 A1    Dec. 19, 2019

(30) Foreign Application Priority Data
Sep. 27, 2017 (CN) .......................... 2017 1 0927745

(51) Int. Cl.
*H01L 27/12* (2006.01)
*G02F 1/133* (2006.01)
(Continued)

(52) U.S. Cl.
CPC .......... *H01L 27/124* (2013.01); *G02F 1/1343* (2013.01); *G02F 1/13306* (2013.01); *G02F 1/13338* (2013.01); *H01L 27/1218* (2013.01)

(58) Field of Classification Search
CPC .......................... H01L 27/124; G02F 1/13338
(Continued)

(56) References Cited

U.S. PATENT DOCUMENTS

2006/0152151 A1* 7/2006 Seo ................. H01L 27/322
                                                             313/506
2007/0058101 A1* 3/2007 Kawasaki ......... G02F 1/133723
                                                             349/43
(Continued)

FOREIGN PATENT DOCUMENTS

| CN | 102082179 A | 6/2011 |
|----|-------------|--------|
| CN | 103578990 A | 2/2014 |
| CN | 106158882 A | 11/2016 |

*Primary Examiner* — Igwe U Anya
(74) *Attorney, Agent, or Firm* — Brinks Gilson & Lione

(57) ABSTRACT

A thin film transistor array substrate and a display apparatus are disclosed. The thin film transistor array substrate includes a number of scan lines, data lines and pixel units. Each of the pixel units includes a thin film transistor and a pixel electrode. The thin film transistor includes a gate electrode, a source electrode and a drain electrode. The gate electrode is electrically connected to one of the scan lines, the source electrode is electrically connected to one of the data lines, and the drain electrode is electrically connected to the pixel electrode. The source electrode is arranged in a same layer as the data lines while the drain electrode and the source electrode are respectively arranged in different layers. Therefore, the implementation of the present disclosure may augment the PPI (Pixel units per Inch) of display apparatus without reducing its aperture ratio and product yield ratio.

12 Claims, 2 Drawing Sheets

(51) Int. Cl.
*G02F 1/1333* (2006.01)
*G02F 1/1343* (2006.01)

(58) Field of Classification Search
USPC .......................................................... 257/79
See application file for complete search history.

(56) References Cited

U.S. PATENT DOCUMENTS

| | | | |
|---|---|---|---|
| 2011/0042656 A1* | 2/2011 | Burroughes | H01L 27/3246 257/40 |
| 2014/0132905 A1 | 5/2014 | Zhang et al. | |
| 2015/0311232 A1* | 10/2015 | Sun | G02F 1/136227 257/72 |
| 2016/0027873 A1 | 1/2016 | Chiang et al. | |
| 2016/0049454 A1* | 2/2016 | Park | H01L 27/3276 257/40 |
| 2016/0329390 A1 | 11/2016 | Ono | |
| 2016/0378233 A1* | 12/2016 | Huo | G06F 3/0412 345/174 |
| 2017/0045984 A1 | 2/2017 | Lu et al. | |
| 2017/0141238 A1 | 5/2017 | Li | |
| 2017/0199605 A1 | 7/2017 | Li et al. | |
| 2018/0076394 A1* | 3/2018 | Kawakami | C07D 307/77 |
| 2018/0097180 A1* | 4/2018 | Kwon | H01L 51/0031 |
| 2019/0013409 A1* | 1/2019 | Li | H01L 29/66969 |

* cited by examiner

THIN FILM TRANSISTOR ARRAY SUBSTRATE AND DISPLAY APPARATUS

CROSS-REFERENCE TO RELATED APPLICATIONS

The present application is a 35 U.S.C. § 371 National Phase conversion of International (PCT) Patent Application No. PCT/CN2017/107152, filed on Oct. 20, 2017, which claims foreign priority to Chinese Patent Application No. 201710927745.6, filed on Sep. 27, 2017 in the State Intellectual Property Office of China, the entire contents of which are hereby incorporated by reference.

TECHNICAL FIELD

The present disclosure generally relates to the display field, and in particular to a thin film transistor array substrate and a display apparatus.

BACKGROUND

In_Cell is a panel configuration integrating the touch panel (TP) in a thin film transistor liquid crystal display (TFT-LCD), which may make the panel (or the whole apparatus) thinner and lighter. For an ordinary In_Cell panel, augmenting the PPI (Pixel units per Inch) of the panel usually results in a decrease of the aperture ratio and the product yield ratio of the pixel units.

SUMMARY

The present disclosure provides a thin film transistor array substrate and a display apparatus for augmenting the PPI of the display apparatus without reducing its aperture ratio and product yield ratio.

To solve the above-mentioned problem, a technical scheme adopted by the present disclosure is to provide a thin film transistor array substrate, including: a glass substrate; a plurality of scan lines formed on the glass substrate; a plurality of data lines crossing the scan lines; a plurality of pixel units formed at the crossing points of the scan lines and the data lines, each of the pixel units including a thin film transistor and a pixel electrode connected to the thin film transistor, wherein, the thin film transistor comprises a gate electrode, a source electrode and a drain electrode, the gate electrode is electrically connected to one of the scan lines, the source electrode is electrically connected to one of the data lines, the drain electrode is electrically connected to the pixel electrode, the source electrode is arranged in a same layer as the data lines, the drain electrode and the source electrode are respectively arranged in different layers; an active layer arranged above the glass substrate, wherein the gate electrode is arranged above the active layer, the scan lines are arranged on a same layer as the gate electrode, the source electrode and the drain electrode are arranged above the gate electrode and electrically connected to the active layer respectively, and the drain electrode is arranged above the source electrode; and a black matrix arranged between the glass substrate and the active layer, configured to prevent light from the glass substrate entering the active layer.

To solve the above-mentioned problem, another technical scheme adopted by the present disclosure is to provide a thin film transistor array substrate, including: a glass substrate; a plurality of scan lines formed on the glass substrate; a plurality of data lines crossing the scan lines; and a plurality of pixel units formed at the crossing points of the scan lines and the data lines; wherein, each of the pixel units comprising a thin film transistor and a pixel electrode connected to the thin film transistor, the thin film transistor comprises a gate electrode, a source electrode and a drain electrode, the gate electrode is electrically connected to one of the scan lines, the source electrode is electrically connected to one of the data lines, the drain electrode is electrically connected to the pixel electrode, the source electrode is arranged in a same layer as the data lines, the drain electrode and the source electrode are respectively arranged in different layers.

To solve the above-mentioned problem, another technical scheme adopted by the present disclosure is to provide a display apparatus, including a thin film array substrate, wherein the thin film array substrate includes: a glass substrate; a plurality of scan lines formed on the glass substrate; a plurality of data lines crossing the scan lines; and a plurality of pixel units formed at the crossing points of the scan lines and the data lines; wherein, each of the pixel units comprising a thin film transistor and a pixel electrode connected to the thin film transistor, the thin film transistor comprises a gate electrode, a source electrode and a drain electrode, the gate electrode is electrically connected to one of the scan lines, the source electrode is electrically connected to one of the data lines, the drain electrode is electrically connected to the pixel electrode, the source electrode is arranged in a same layer as the data lines, the drain electrode and the source electrode are respectively arranged in different layers.

The present disclosure provides a thin film transistor array substrate and a display apparatus. The thin film transistor array substrate may include a glass substrate, a plurality of scan lines formed on the glass substrate, a plurality of data lines crossing the scan lines, and a plurality of pixel units formed at the crossing points of the scan lines and the data lines. Each of the pixel units may include a thin film transistor and a pixel electrode connected to the thin film transistor. The thin film transistor may include a gate electrode, a source electrode and a drain electrode. The gate electrode is electrically connected to one of the scan lines, the source electrode is electrically connected to one of the data lines, and the drain electrode is electrically connected to the pixel electrode. The source electrode is arranged in a same layer as the data lines while the drain electrode and the source electrode are respectively arranged in different layers. Since the source electrode and the data line are in the same layer while the source electrode and the drain electrode are in different layers, the distance between the drain electrode and the data line will not be reduced when smaller pixel units are made by reducing the distance between two adjacent data lines, i.e., the limit of the drain electrode may be eliminated. Therefore, the position of the drain electrode and the source electrode may be kept and their sizes may be large enough to assure the aperture ratio and the product yield ratio of the pixel units. That is to say, the implementation of the present disclosure may allow augmenting the PPI of the display apparatus without reducing its aperture ratio and product yield ratio of the pixel units.

DETAILED DESCRIPTION

The disclosure will now be described in detail with reference to the accompanying drawings and examples. Apparently, the embodiments described are merely a portion but not all of the embodiments of the present disclosure. Embodiments obtained by those skilled in the art based on the embodiments of the present disclosure without creative efforts should all belong to the protection scope of the present disclosure.

Figure 1:
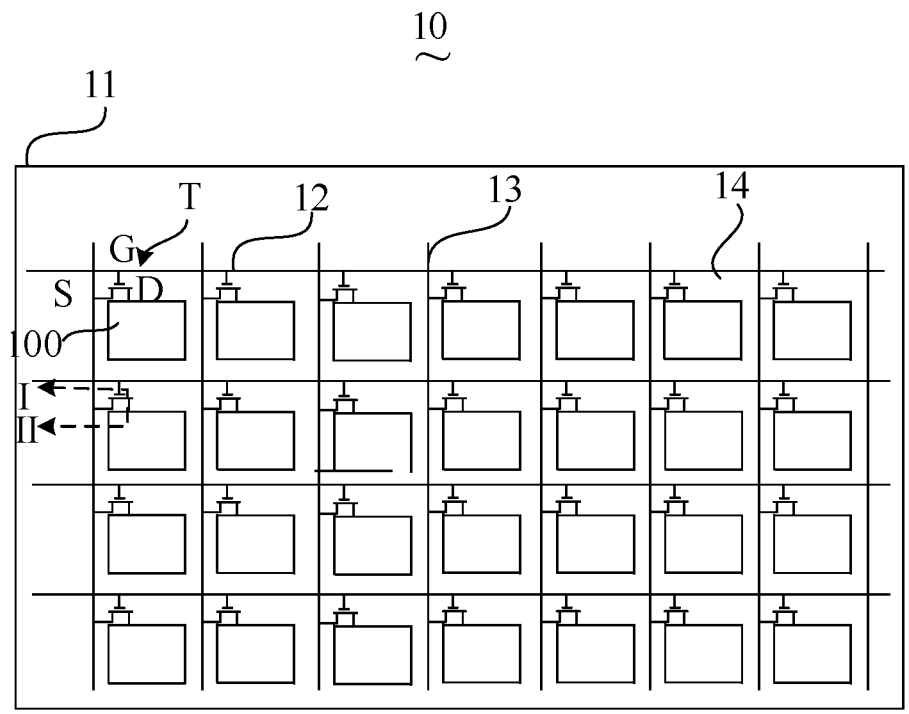
FIG. 1 is a schematic diagram of a thin film transistor array substrate according to an embodiment of the present disclosure.
Figure 2:
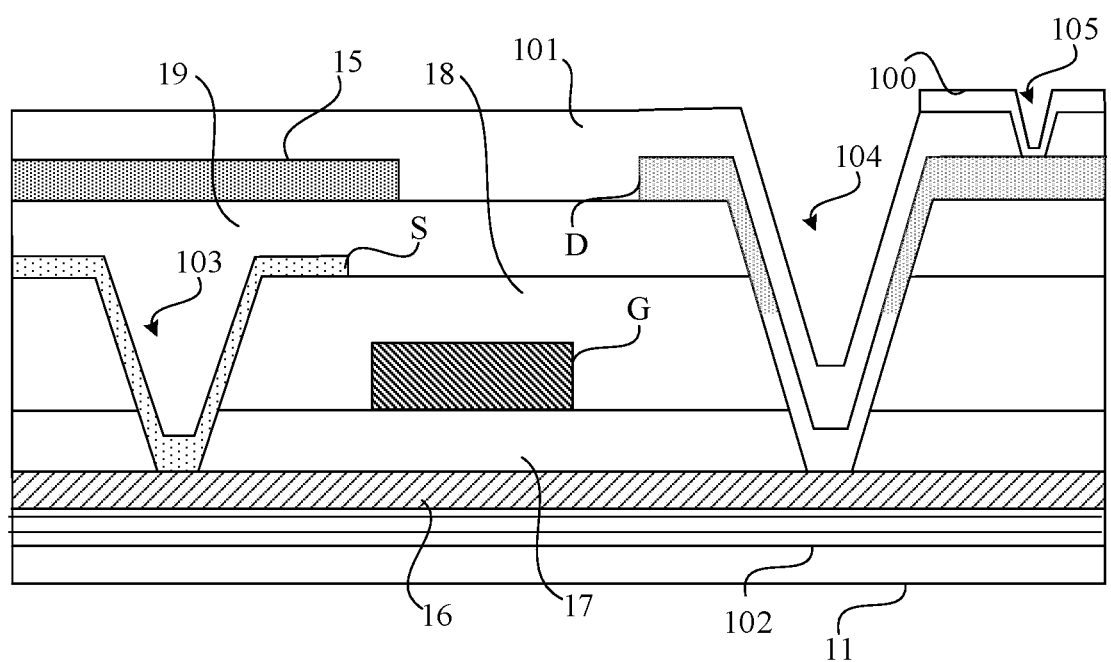
FIG. 2 is a cross-section view of the pixel unit taken along the line I-II of FIG. 1.
Figure 3:
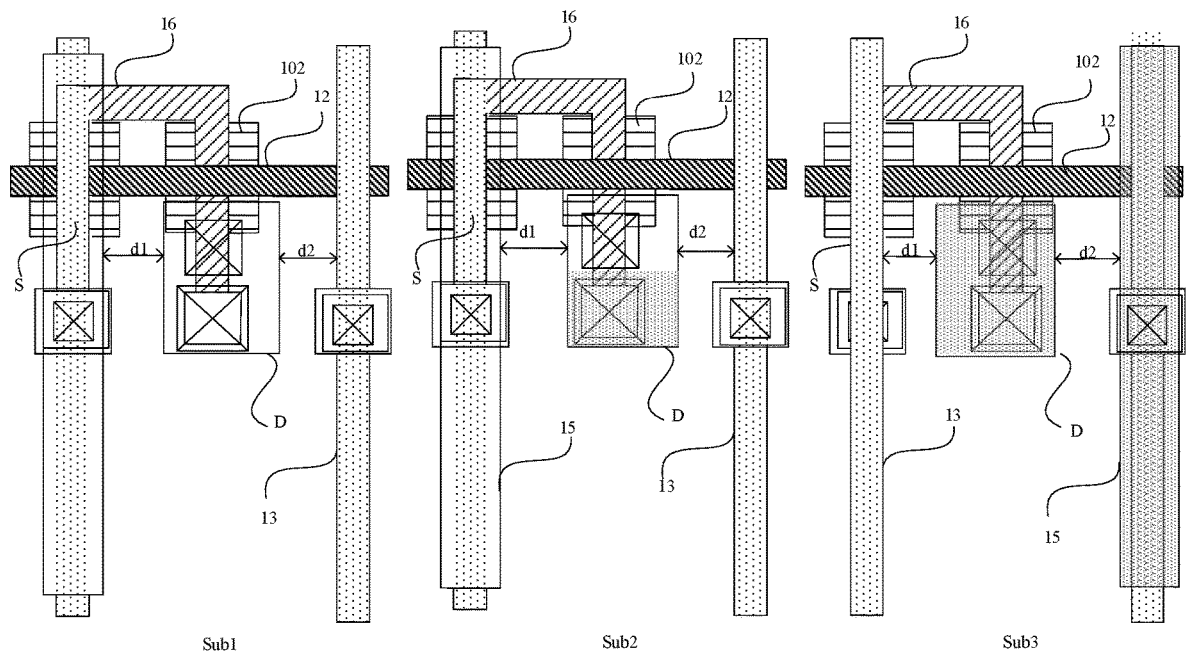
FIG. 3 is an enlarged view of the pixel unit of the thin film transistor array substrate of FIG. 1.

Referring to FIGS. 1-3, FIG. 1 is a schematic diagram of a thin film transistor array substrate according to an embodiment of the present disclosure. FIG. 2 is a cross-section view of the pixel unit taken along the line I-II of FIG. 1. FIG. 3 is an enlarged view of the pixel unit of the thin film transistor array substrate of FIG. 1. As shown in FIG. 1, the thin film transistor array substrate 10 of this embodiment may include a glass substrate 11, multiple scan lines 12 formed on the glass substrate 11, multiple data lines 13 crossing the scan lines 12 and multiple pixel units 14 formed at the crossing points of the scan lines 12 and the data lines 13. Each of the pixel units 14 may include a thin film transistor T and a pixel electrode 100 connected to the thin film transistor T.

Referring to FIGS. 2 and 3, in this embodiment, the thin film transistor T may include a gate electrode G, a source electrode S and a drain electrode D. The gate electrode G may be electrically connected to the scan line 12. The source electrode S may be electrically connected to the data line 13. The drain electrode D may be electrically connected to the pixel electrode 100. In this embodiment, the source electrode S may be arranged in a same layer as the data line 13 while the drain electrode D and the source electrode S are respectively arranged in different layers.

Since the source electrode S and the data line 13 are in the same layer and the source electrode S and the drain electrode D are in different layers, the distance between the drain electrode D and the data line 13 will not be reduced when the pixel units 14 with smaller sizes are made by reducing the distance between two adjacent data lines 13, i.e., the limit of the drain electrode D may be eliminated. Therefore, the position and size of the drain electrode D and the source electrode S may be kept and their sizes may be large enough to assure the aperture ratio and the product yield ratio of the pixel units. That is to say, the implementation of the present disclosure may allow augmenting the PPI of the display apparatus without reducing its aperture ratio and product yield ratio of the pixel units 14.

In this embodiment, the thin film transistor array substrate 10 may further include an active layer 16 disposed above the glass substrate 11. The gate electrode G may be disposed above the active layer 16 and in the same layer as the scan line 12. The source electrode S and the drain electrode D may be disposed above the gate electrode G, wherein the drain electrode D may be disposed above the source electrode S. The source electrode S and the drain electrode D may be electrically connected to the active layer 16 respectively.

In other embodiments, the drain electrode D may be arranged below the source electrode S and the data line 13, or in other position as long as the source electrode S and the data line 13 are in different layers and the active layer 16 is electrically connected to the pixel electrode 100.

In this embodiment, the thin film transistor array substrate 10 may further include a first insulating layer 17, a second insulating layer 18, a third insulating layer 19 and a fourth insulating layer 101. The first insulating layer 17 may be arranged between the active layer 16 and the gate electrode G. The second insulating layer 18 may be arranged between the gate electrode G and the source electrode S. The second insulating layer 18 may define a first guiding hole 103 which is not closed by the first insulating layer 17 such that the active layer 16 may be exposed. The source electrode S may be electrically connected to the active layer 16 through the first guiding hole 103. The third insulating layer 19 may be arranged between the source electrode S and the drain electrode D. The third insulating layer 19 may define a second guiding hole 104. Neither the first insulating layer 17 nor the second insulating layer 18 closes the second guiding hole 104 such that the active layer 16 may be exposed. The drain electrode D may be electrically connected to the active layer 16 through the second guiding hole 104. The fourth insulating layer 101 may be arranged on the drain electrode D. The fourth insulating layer 101 may define a third guiding hole 105 for exposing the drain electrode D. The pixel electrode 100 may be arranged on the fourth insulating layer 101 electrically connected to the drain electrode D through the third guiding hole 105.

In this embodiment, the gate electrode G, the source electrode S and the drain electrode D may include three different metal materials or other conducting materials. Alternatively, they may include the same metal material or conducting material.

In this embodiment, the thin film transistor array substrate 10 may provide touch function. The thin film transistor array substrate 10 may further include touch control signal lines 15. The touch control signal line 15 may be arranged in the same layer as the drain electrode D. The touch control signal line 15 and the drain electrode D may include the same material and formed with one photolithography process such that the cost will not be increased. In other embodiments, the touch control signal line 15 and the drain electrode D may include different materials.

The touch control signal line 15 may be disposed above the data line 13 and parallel to the data line 13. Since the number of the touch control signal lines 15 is determined by the number of touch control units, and the number of touch control units is less than the pixel units, not all the data lines 13 have a touch control signal line 15 disposed above. More specifically, referring to FIG. 3, the pixel units Sub1, Sub2 and Sub 3 are pixel units in a same line which may display different colors. Among the pixel units in the same line, at least one of two adjacent pixel units 14 does not have the touch control signal line 15 disposed above. As shown in FIG. 3, the pixel units Sub2 and Sub3 may have the touch control signal lines 15 disposed above while the pixel unit Sub1 does not. Among the pixel units in a same line, the distance d1 between the drain electrode D and the touch control signal line 15 may be larger than the distance d2 between the drain electrode D and the data line 13 of an adjacent pixel unit, which is the configuration of Sub2. Since the touch control signal line 15 is parallel to the data line 13, the distance d between the drain electrode D of the pixel unit Sub2 and its data line 13 may be larger than the distance d2 between the drain electrode D and the data line 13 of the adjacent pixel unit. Alternatively, the distance d2 between the drain electrode D and the touch control signal line 15 may be larger than the distance d1 between the drain electrode D of a pixel unit and its data line 13, which is the configuration of Sub3. Similarly, the distance d1 between the drain electrode D of the pixel unit Sub3 and its data line 13 may be smaller than the distance d2 between the drain electrode D and the data line 13 of an adjacent pixel unit. Therefore, the electrical connection of the drain electrode D and the touch control signal line 15 may be avoided such that the pixel units may function normally when the size of the pixel units are reduced. As a result, it is possible to augment the PPI of panel.

It should be noted that for the pixel unit Sub1 which does not include the touch control signal line 15, the distance d1 between its drain electrode D and its data line 13 may be equal to the distance d2 between its drain electrode D and the data line 13 of an adjacent pixel unit.

Referring to FIG. 2, the thin film transistor array substrate 10 may further include a black matrix 102. The black matrix 102 may be arranged between the glass substrate 11 and the active layer 16. The black matrix 102 may be configured to prevent light from the glass substrate 11 entering the active layer 16.

Correspondingly, the implementation of the present disclosure may allow augmenting the PPI of display apparatus without reducing the aperture ratio and product yield ratio of its pixel units 14.

Figure 4:
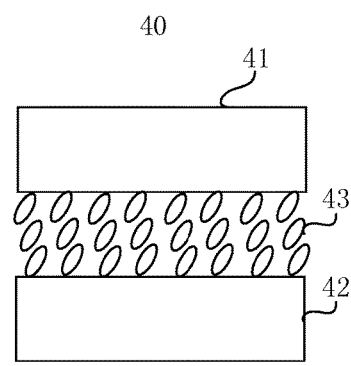
FIG. 4 is a schematic diagram of a display apparatus according to an embodiment of the present disclosure.

Referring to FIG. 4, the present disclosure further provides a display apparatus.

As shown in FIG. 4, according to an embodiment, the display apparatus 40 may include a thin film transistor array substrate 41, a color filter substrate 42 and a liquid crystal layer 43. The thin film transistor array substrate 41 and the color filter substrate 42 may be disposed correspondingly. The liquid crystal layer 43 may be arranged between the thin film transistor array substrate 41 and the color filter substrate 42. The thin film transistor array substrate 41 is the thin film transistor array substrate 10 as set forth and will not be described hereon.

As a conclusion, the implementation of the present disclosure allow augmenting the PPI of display apparatus without reducing the aperture ratio and product yield ratio of its pixel units 14.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A thin film transistor array substrate, comprising:
a glass substrate;
a plurality of scan lines formed on the glass substrate;
a plurality of data lines crossing the scan lines; and
a plurality of pixel units formed at crossing points of the scan lines and the data lines,
each of the pixel units comprising a thin film transistor and a pixel electrode connected to the thin film transistor, wherein the thin film transistor comprises a gate electrode, a source electrode and a drain electrode; the gate electrode is electrically connected to one of the scan lines, the source electrode is electrically connected to one of the data lines, and the drain electrode is electrically connected to the pixel electrode;
wherein the source electrode is disposed in a same first layer as the data lines, and the drain electrode and the source electrode are respectively disposed in different layers;
wherein thin film transistor array substrate further comprises:
an active layer disposed above the glass substrate, wherein the gate electrode is disposed above the active layer, the scan lines are disposed on a same second layer as the gate electrode, the source electrode and the drain electrode are disposed above the gate electrode and electrically connected to the active layer respectively; wherein the drain electrode is disposed above the source electrode, and the source electrode and the drain electrode comprise different materials; and
a plurality of touch control signal lines disposed in a same third layer as the drain electrode, wherein the touch control signal lines and the drain electrode comprise a same material.

2. The thin film transistor array substrate of claim 1, further comprising:
a first insulating layer disposed between the active layer and the gate electrode;
a second insulating layer disposed between the gate electrode and the source electrode, wherein the first insulating layer and the second insulating layer cooperatively define a first guiding hole for exposing the active layer, the source electrode is electrically connected to the active layer through the first guiding hole;
a third insulating layer disposed between the source electrode and the drain electrode, wherein the first insulating layer, the second insulating layer and the third insulating layer cooperatively define a second guiding hole for exposing the active layer, the drain electrode is electrically connected to the active layer through the second guiding hole; and
a fourth insulating layer disposed on the drain electrode, wherein the fourth insulating layer defines a third guiding hole for exposing the drain electrode, the pixel electrode is disposed on the fourth insulating layer and electrically connected to the drain electrode through the third guiding hole.

3. The thin film transistor array substrate of claim 1, wherein the touch control signal lines are parallel to the data lines and disposed above the data lines, at least one of every two adjacent pixel units extending along two adjacent data lines does not have any of the touch control signal lines.

4. The thin film transistor array substrate of claim 3, wherein in the pixel units extending along a first data line, a first distance between the drain electrode and a touch control signal line of a same pixel unit is larger than a second distance between said drain electrode and a data line of pixel unit adjacent to the same pixel unit extending along a second data line adjacent to the first data line.

5. The thin film transistor array substrate of claim 1, further comprising a black matrix disposed between the glass substrate and the active layer, configured to prevent light from the glass substrate entering the active layer.

6. A display apparatus, comprising a thin film array substrate, the thin film array substrate comprising:
a glass substrate;
a plurality of scan lines formed on the glass substrate;
a plurality of data lines crossing the scan lines; and
a plurality of pixel units formed at the crossing points of the scan lines and the data lines,
each of the pixel units comprising a thin film transistor and a pixel electrode connected to the thin film transistor, wherein the thin film transistor comprises a gate electrode, a source electrode and a drain electrode; the gate electrode is electrically connected to one of the scan lines, the source electrode is electrically connected to one of the data lines, and the drain electrode is electrically connected to the pixel electrode; wherein the source electrode is disposed in a same first layer as the data lines, and the drain electrode and the source electrode are respectively disposed in different layers; wherein the thin film array substrate further comprises:

an active layer disposed above the glass substrate, wherein the gate electrode is disposed above the active layer, the scan lines are disposed on a same second layer as the gate electrode, the source electrode and the drain electrode are disposed above the gate electrode and electrically connected to the active layer respectively; wherein the drain electrode is disposed above the source electrode, and the source electrode and the drain electrode comprise different materials; and a plurality of touch control signal lines disposed in a same third layer as the drain electrode, wherein the touch control signal lines and the drain electrode comprise a same material.

7. The display apparatus of claim 6, wherein the thin film array substrate further comprises:

a first insulating layer disposed between the active layer and the gate electrode;

a second insulating layer disposed between the gate electrode and the source electrode, wherein the first insulating layer and the second insulating layer cooperatively define a first guiding hole for exposing the active layer, the source electrode is electrically connected to the active layer through the first guiding hole;

a third insulating layer disposed between the source electrode and the drain electrode, wherein the first insulating layer, the second insulating layer and the third insulating layer cooperatively define a second guiding hole for exposing the active layer, the drain electrode is electrically connected to the active layer through the second guiding hole;

a fourth insulating layer disposed on the drain electrode, wherein the fourth insulating layer defines a third guiding hole for exposing the drain electrode, the pixel electrode is disposed on the fourth insulating layer and electrically connected to the drain electrode through the third guiding hole.

8. The display apparatus of claim 6, wherein the touch control signal lines are parallel to the data lines and disposed above the data lines, at least one of every two adjacent pixel units extending along two adjacent data lines does not have any of the touch control signal lines.

9. The display apparatus of claim 8, wherein a first distance between the drain electrode and a touch control signal line of a same pixel unit is larger than a second distance between said drain electrode and a data line of a pixel unit adjacent to the same pixel unit.

10. The display apparatus of claim 6, wherein the thin film transistor array substrate further comprises:

a black matrix disposed between the glass substrate and the active layer, configured to prevent light from the glass substrate entering the active layer.

11. A thin film transistor array substrate, comprising:
a glass substrate;
a plurality of scan lines formed on the glass substrate;
a plurality of data lines crossing the scan lines;
a plurality of pixel units at the crossing points of the scan lines and the data lines; and
a plurality of touch control signal lines;
each of the pixel units comprising a thin film transistor and a pixel electrode,
wherein the thin film transistor comprises:
an active layer formed on the glass substrate;
a first insulating layer formed on the active layer;
a gate electrode formed on the first insulating layer and electrically connected to one of the scan lines;
a second insulating layer covering the gate electrode and formed on the first insulating layer;
a source electrode formed on the second insulating layer and electrically connected to one of the data lines, wherein the first insulating layer and the second insulating layer cooperatively define a first guiding hole for exposing the active layer, the source electrode is electrically connected to the active layer through the first guiding hole;
a third insulating layer covering the source electrode and formed on the second insulating layer;
a drain electrode formed on the third insulating layer, wherein the first insulating layer, the second insulating layer and the third insulating layer cooperatively define a second guiding hole for exposing the active layer, the drain electrode is electrically connected to the active layer through the second guiding hole;
a fourth insulating layer covering the drain electrode and formed on the third insulating layer, wherein the fourth insulating layer defines a third guiding hole for exposing the drain electrode, the pixel electrode is electrically connected to the drain electrode through the third guiding hole;
wherein the source electrode is disposed in a same first layer as the data lines; the scan lines are disposed on a same second layer as the gate electrode; wherein the drain electrode comprise different materials;
the plurality of touch control signal lines are disposed in a same layer as the drain electrode, wherein the touch control signal lines and the drain electrode comprise a same material.

12. The thin film transistor array substrate of claim 11, further comprising:

a black matrix disposed between the glass substrate and the active layer, configured to prevent light from the glass substrate entering the active layer.

* * * * *